under 35 U.S.C. 154(b) by 0 days.

(12) United States Patent
Allain et al.

(10) Patent No.: US 10,309,006 B2
(45) Date of Patent: Jun. 4, 2019

(54) METHODS FOR DIRECTED IRRADIATION SYNTHESIS WITH ION AND THERMAL BEAMS

(71) Applicant: Purdue Research Foundation, West Lafayette, IN (US)

(72) Inventors: Jean Paul Allain, Lafayette, IN (US); Osman J. El-Atwani, Lafayette, IN (US); Juan Jose Pavon Palacio, Medellin (CO)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/924,026

(22) Filed: Mar. 16, 2018

(65) Prior Publication Data

US 2018/0209032 A1    Jul. 26, 2018

Related U.S. Application Data

(63) Continuation of application No. 14/441,140, filed as application No. PCT/US2013/068819 on Nov. 6, 2013, now Pat. No. 9,932,664.

(Continued)

(51) Int. Cl.
*C23C 14/22* (2006.01)
*H01J 37/304* (2006.01)
(Continued)

(52) U.S. Cl.
CPC ............ *C23C 14/221* (2013.01); *B82Y 40/00* (2013.01); *H01J 37/302* (2013.01); *H01J 37/304* (2013.01);
(Continued)

(58) Field of Classification Search
CPC .. H01J 37/317; H01J 2237/317; H01J 37/302; H01J 37/304; C23C 14/221; B82Y 40/00
See application file for complete search history.

(56) References Cited

U.S. PATENT DOCUMENTS 4,831,628 A * 5/1989 Tsang ..................... B82Y 10/00
117/918
4,925,700 A * 5/1990 Brezoczky ............... G11B 5/84
427/128

(Continued)

FOREIGN PATENT DOCUMENTS

JP    2011185845 A    9/2011
WO    2010006188 A2    1/2010
WO    2010112827 A2    10/2010

OTHER PUBLICATIONS

International Search Report and Written Opinion of PCT/US2013/068819, dated Feb. 17, 2014.

(Continued)

*Primary Examiner* — Wyatt A Stoffa
(74) *Attorney, Agent, or Firm* — Maginot, Moore & Beck LLP

(57) ABSTRACT

A method for fabricating structures includes on a substrate includes providing a set of control parameters to an ion beam source and to a thermal source corresponding to a desired structure topology. The method also includes using directed irradiation synthesis to form nano structures and/or microstructures in a first surface area of the substrate by exposing the substrate surface to an ion beam from the ion beam source and to thermal particles from the thermal source. The ion beam having a first area of effect on the substrate surface, and the thermal particles having a second area of effect on the substrate surface, each of the first area of effect and the second area of effect including the first surface area.

12 Claims, 14 Drawing Sheets

Related U.S. Application Data

(60) Provisional application No. 61/723,039, filed on Nov. 6, 2012.

(51) Int. Cl.
 *H01J 37/302* (2006.01)
 *B82Y 40/00* (2011.01)

(52) U.S. Cl.
 CPC ...... *H01J 2237/317* (2013.01); *Y10S 977/896* (2013.01)

(56) References Cited

U.S. PATENT DOCUMENTS

| | | | |
|---|---|---|---|
| 4,944,961 A * | 7/1990 | Lu | C23C 14/221 |
| | | | 257/E21.583 |
| 5,122,483 A * | 6/1992 | Sakai | H01L 21/02164 |
| | | | 257/E21.274 |
| 5,412,210 A | 5/1995 | Todokoro | |
| 5,492,605 A * | 2/1996 | Pinarbasi | B82Y 25/00 |
| | | | 204/192.11 |
| 5,866,904 A | 2/1999 | Todokoro | |
| 6,172,365 B1 | 1/2001 | Hiroi | |
| 6,236,163 B1 | 5/2001 | Maishev | |
| 7,034,091 B2 * | 4/2006 | Schultz | B01J 19/0046 |
| | | | 257/E43.005 |
| 7,449,699 B1 * | 11/2008 | Adams | H01J 37/228 |
| | | | 250/307 |
| 7,642,514 B2 | 1/2010 | Takane | |
| 7,846,738 B2 | 12/2010 | Golovchenko et al. | |
| 8,394,640 B2 | 3/2013 | Golovchenko | |
| 9,347,127 B2 * | 5/2016 | Druz | C23C 14/081 |
| 2001/0033683 A1 | 10/2001 | Tanaka | |
| 2002/0092473 A1 * | 7/2002 | Sainty | C23C 14/221 |
| | | | 118/723 FI |
| 2002/0127438 A1 * | 9/2002 | Cook | C23C 14/22 |
| | | | 428/701 |
| 2003/0024807 A1 * | 2/2003 | Baldwin | C23C 14/46 |
| | | | 204/192.12 |
| 2004/0164244 A1 | 8/2004 | Hiroi | |
| 2004/0168636 A1 * | 9/2004 | Savvides | C23C 14/083 |
| | | | 118/723 CB |
| 2004/0171178 A1 | 9/2004 | Scott et al. | |
| 2005/0082476 A1 | 4/2005 | Hiroi | |
| 2006/0071167 A1 | 4/2006 | Todokoro | |
| 2006/0151700 A1 | 7/2006 | Honda | |
| 2008/0050910 A1 * | 2/2008 | Hart | G02B 1/10 |
| | | | 438/622 |
| 2008/0073580 A1 * | 3/2008 | Phaneuf | H01J 37/3005 |
| | | | 250/492.21 |
| 2008/0314272 A1 | 12/2008 | Rosenman | |
| 2009/0069904 A1 | 3/2009 | Picha | |
| 2009/0152461 A1 | 6/2009 | Kim | |
| 2010/0027118 A1 | 2/2010 | Rosenman | |
| 2010/0136717 A1 | 6/2010 | Shin | |
| 2011/0012029 A1 | 1/2011 | Abe | |
| 2011/0198497 A1 | 8/2011 | Biberger et al. | |
| 2012/0068065 A1 | 3/2012 | Mitsui | |
| 2012/0080597 A1 | 4/2012 | Shin | |
| 2012/0208377 A1 * | 8/2012 | Timans | H01L 21/67115 |
| | | | 438/799 |
| 2014/0014497 A1 * | 1/2014 | Druz | C23C 14/081 |
| | | | 204/192.11 |
| 2014/0339425 A1 | 11/2014 | Yano | |
| 2016/0071688 A1 | 3/2016 | Goto | |

OTHER PUBLICATIONS

Germain, M. et al., GaN-on-Silicon Wafers: The Enabler of GaN Power Electronics, Power Device 4, Jan. 2012, pp. 6-9.

* cited by examiner

High resolution TEM image

METHODS FOR DIRECTED IRRADIATION SYNTHESIS WITH ION AND THERMAL BEAMS

This application is a continuation of U.S. patent application Ser. No. 14/441,140, filed May 6, 2015, which is a National Phase of International Application no. PCT/US2013/068819, filed Nov. 6, 2013, which in turn claims the benefit of priority of U.S. provisional application Ser. No. 61/723,039, filed Nov. 6, 2012, the disclosures of all of which are incorporated by reference herein in their entirety.

TECHNICAL FIELD

The present disclosure is related to high-volume nanomanufacturing multi-functional nano- and micro-scale structures with applications in energy, catalysis, nanophotonics, nanoelectronics, surface engineering and biomaterials, and particularly related to a process, process tooling and nano and micro-scale multi-functional structures synthesized with sequenced, asymmetric ion and thermal beams.

BACKGROUND

Ion beams can be used to induce patterned structures and unique topography at the nanoscale by means of sputtering and other surface-related processes. This approach can have significant implications to the design of nano structured surfaces used for cell engineering and cell biology.

Irradiation-driven systems have been explored in similar moderate energy regimes dominated by knock-on atom displacement regimes for semiconductor metallization microstructure control, artificial texturing of ceramics, engineering of nanostructured carbon, and compositional patterning of immiscible alloys. Such findings suggest that irradiation-driven self-organized structures can have critical effects on surface properties of low dimensional state structures.

However, irradiation-driven systems have been limited to the study of dissipative systems leading to permanent damage by operating in energy and flux regimes that limit self-organization of low-dimensional state structures. Despite the use of low-energy ion-beams, there remain difficulties with control of short and long-range ordering, surface chemistry and topographical control. In addition, despite numerous experiments and models that have investigated ioninduced surface nanopatterning; synthesis design for ion-induced biomaterials functionalization remains absent. Ion-induced strategies are only used for biocompatibility enhancement. One important limitation in current nanomanufacturing is its dependence on naturally self-ordered processes that balance kinetic and thermodynamic dissipative forces in the absence of irradiation techniques. This dependence leads to limited control of surface chemistry and functionalization. Furthermore top-bottom and bottom-up surface patterning is predominantly dependent on focused beam technology. One example is the use of electron and ion-beam nanolithography, which pose an order-of-magnitude limitations towards high-volume manufacturing.

Therefore, there is a need for a novel process that removes the aforementioned limitations toward high-volume manufacturing and which is scalable.

SUMMARY OF THE INVENTION

The present disclosure provides a novel process and arrangement to generate patterned structures and unique topography at the nanoscale while eliminating the shortcomings of the prior approaches related to high-volume manufacturing resulting in a process that is scalable to by virtue of its intrinsic large-area simultaneous exposure of materials surfaces and interfaces.

In a first embodiment, a method for fabricating structures on substrate having a substrate surface includes providing a set of control parameters to an ion beam source and thermal source corresponding to a desired nanostructure topology. The method also includes forming a plurality of nano structures in a first surface area of the substrate by exposing the substrate surface to an ion beam from the ion beam source and thermal energy from the thermal source. The ion beam has a first area of effect on the substrate surface, and the thermal energy has an second area of effect on the substrate surface. Each of the first area and the second area includes the first surface area. In other words, the coincident beams under the set of control parameters produce a plurality of microstructures or nano structures.

The above-described features and advantages, as well as others, will become more readily apparent to those of ordinary skill in the art by reference to the following detailed description and accompanying drawings.

DETAILED DESCRIPTION

Figure 1:
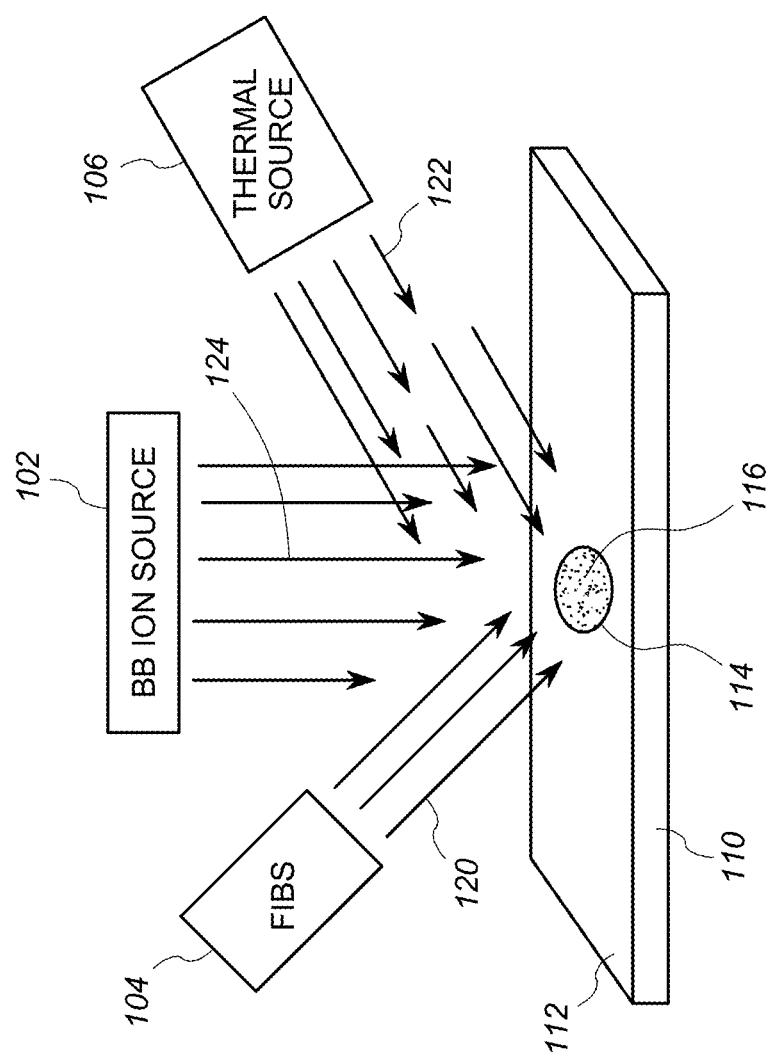
FIG. 1 shows a schematic of the components used to carry out exemplary DIS processes according to an exemplary embodiment of the invention.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In at least some embodiments described herein, broad-beam ions combined with rastered focused ions and gradient ion-beam profiles are sequenced and/or combined with reactive and/or non-reactive thermal beams that control the surface topography, chemistry and structure at the micro and nano scale. The technology described in the present disclosure advantageously benefits from a self-organized arrangement in irradiated surfaces dominated by ion-induced erosion and surface diffusion. The technology as described in the present disclosure can transform the synthesis and design of nano-structured systems by identifying the composition-dependent mechanisms that drive self-organization on irradiation-driven micro- and nano-structures enabling tunability and control of their chemical and electronic properties. In particular, the technology as described in the present disclosure has important ramifications for biomaterials which is important for introducing novel design pathways tuning bioactive properties of thin-film coatings used in multiple applications for biocompatibility and bio-surface material adaptability.

The technology as described in the present disclosure includes three parts: 1) an advanced synthesis process (identified below as directed irradiation synthesis), 2) an advanced tool particular for this process and 3) unique multi-functional micro- and nano-scale structures generated as a result of the processing.

Directed irradiation synthesis (DIS), uniquely couples ion-beam surface irradiation and thermal particle exposure to induce complex macro and nano-scale structures that result in enhanced optical, electronic, chemical, biological and/or magnetic properties. One key feature is that from one process step multi-functional micro and/or nano-scale structures can be synthesized with scalability to high-volume manufacturing (HVM). This scalability is on par with current top-down techniques such as focused-charged particle beam lithography that are orders of magnitude short of relevant HVM throughput. Furthermore, this synthesis approach is on par with typical bottom-up techniques that rely on thermal-chemical reactions from either chemical solutions or nano-imprint technologies. These approaches lack high fidelity control and manipulation of physical properties; for example where only one property can be controlled in a narrow set of synthesis variables (e.g. temperature, chemical potential, etc.). In addition these techniques have a limited range of material classes they can modify (e.g. ceramics vs. polymers vs. metals). The technology described in the present disclosure can therefor advantageously provide a scalable, low-cost, modification tool and process that can manufacture multi-functional micro- and nano-scale structures on a large class of materials.

The advanced DIS tool, described below in connection with FIG. 7, includes coupling of an in-situ surface characterization diagnostic coupled to process modification sources (e.g. broad-beam, focused-beam and thermal-beam) to allow complete multi-scale (e.g. from nano to micro) control of properties and function. The micro and nano-scale structures synthesized by DIS are uniquely characterized by their multi functional capability (e.g. a region of the material rendered both magnetic and biomimetic as well as contain nanophotonic features for sensing).

FIG. 1 shows a schematic of the components used to carry out exemplary DIS processes according to the invention. As shown in FIG. 1, at least one embodiment of a system 100 for carrying out DIS includes a broad beam ion source (BBIS) 102, a rastered focused ion-beam source (FIBS) 104, and a thermal particle source 106. The BBIS 102 is coupled to the FIBS 104 and is matched with the thermal particle source 106. The thermal particles generated by the thermal particle source can be reactive or non-reactive. For other example processes, the BBIS 102 is coupled to a plurality of rastered focused ion-beam sources similar to the FIBS 104 and/or a plurality of thermal particles sources.

It will be appreciated that in the embodiments described herein, the term focused ion beam or FIBS is not intended to cover items that produce ion beams with spot sizes on the order of a few microns, but also ion beams with spot sizes up to on the order of 0.1-5.0 mm in size. The term focused ion beam is used merely to distinguish the beam and beam source from those of the broad beam ion source 102.

In accordance with at least some exemplary DIS processes, such as those discussed below in connection with FIG. 2, the flux ratios of each source is varied according to energy-material surface interaction matching that results in balancing the thermal atom composition and ion-induced erosion and surface diffusion yielding novel surface structuring.

Figure 3:
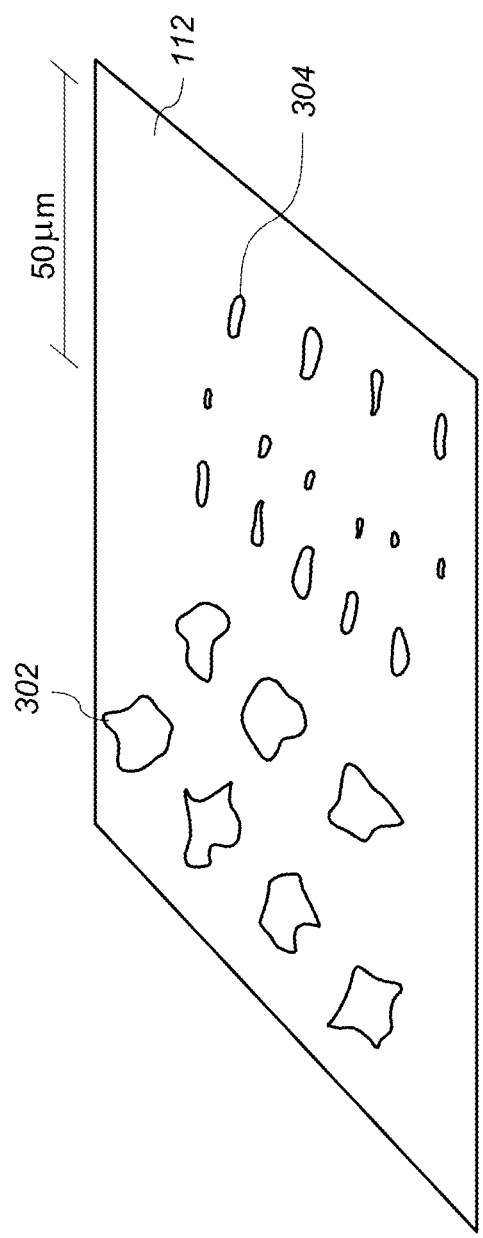
FIG. 3 shows a schematic of exemplary microstructures generated on a substrate surface in accordance with an embodiment of the invention.

Also shown in FIG. 1 is a substrate 110 having a substrate surface 112. In general, the sources 102, 104 and 106 are configured such that they all simultaneously operate on the same work area of the substrate surface 112. By way of example, FIG. 3 shows a schematic of DIS-generated microstructures 302 and smaller microstructures 304 on the substrate surface 112 generated by the system 100 of FIG. 1. The DIS-derived microstructure 302 and smaller microstructures 304 have a shape and size varies with space along a 150.times.150.mu.m view. The surface chemistry of each of the structures also varies as a function of the particle-beam configuration.

Figure 2:
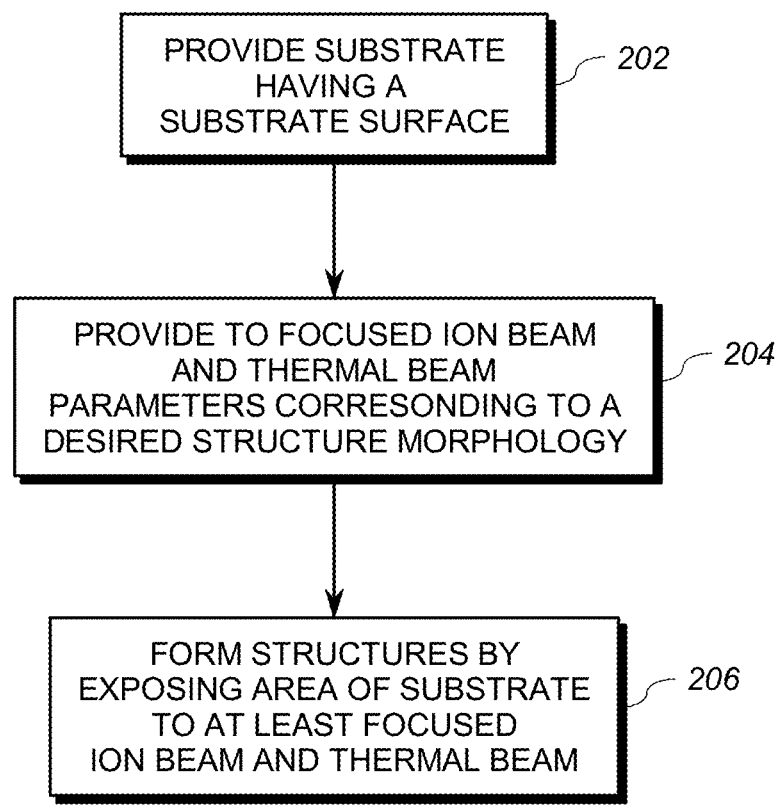
FIG. 2 shows a flow diagram of an exemplary embodiment of a DIS process that may be carried out by the components of FIG. 1.

FIG. 2 shows a flow diagram of an exemplary embodiment of a DIS process that may be carried out by the arrangement of FIG. 1. In this embodiment, the DIS process produces microstructures or nano structures on the substrate surface 112, each of which is a small fraction of the size of the smallest beam produced by the sources 102, 104, 106. As will be discussed below, the morphology of the nano structures and microstructures, including the size, shape, and spacing thereof, can be controlled by altering parameters of one or more the operational parameters of the sources 102, 104, and 106. Because the beams are larger than the produced structures, large scale production of surfaces of with multiple micro or nano structures can be accomplished more quickly than using individualized top-down processing, or conventional bottom-up processing.

In a first step 202, the substrate 110 having the substrate surface 112 is provided in a fixture, not shown, where the sources 102, 104 and 106 may operate on the substrate 110 and/or substrate surface 112. In an example, the substrate surface 112 should be relatively smooth, having a roughness of approximately 0.3 to 0.5 nm root-mean-square. To this end, the substrate 110 may suitably be a silicon substrate with an ultra-thin film of 40-50 nm precious metal deposited thereon, forming the substrate surface 112. The thin film substrate surface 112 may be formed of Rhodium (Rh), Ruthenium (Ru) or Palladium (Pd).

In a second step 204, a set of control parameters are provided to at least the FIBS 104 and the thermal source 106. The set of control parameters corresponds to a desired nanostructure topology. In the example generating the structures of FIG. 3, a set of control parameters are provided to the BBIS 102, as well as the FIBS 104 and thermal source 106. The parameters can include any and all parameters that affect or define the beams generated by the FIBS 104, thermal source 106 and the BBIS 102. The parameter control may occur in an automated fashion, such as under the control of a numerical control device or a general purpose or special purpose computer. Each of such automation elements, not shown, includes a processing device and a memory containing programming instructions, not shown, which cause the processing device to provide the parameters, in conjunction with the standard control equipment of the beam sources 102, 104 and/or 106. The memory may also contain a database that associates desired nanostructure or microstructure morphologies with specific corresponding beam parameters.

In this case, the FIBS 104 is configured to provide heavy ions, such as Tin (Sn) or Xenon (Xe). The parameters provided to the FIBS 104 those that produce a beam 120 at an energy of between 500 and 1000 eV to a spot of about 0.5 mm to 1.0 mm. In one embodiment, the FIBS 104 is configured to have an ion-beam profile that decrease its flux 66% over the full diameter of the beam. As will be discussed below, this allows a single beam operation to create sets of nanostructures having a controlled variety of sizes. Decreasing the flux 66% over the full diameter allows the morphology of the nanostructures to vary between 5-10.mu.m. Suitable controls sufficient to generate the focused ion beam sources are conventional and known.

The parameters of the thermal source 106 are those that produce a collimated thermal beam (122) spot of low-wetting material, such as Tin (Sn), which is deposited on the surface of the substrate surface 112. The substrate surface 112 in this example may suitably be a thin film of Ruthenium (Ru). Preferably, the area of deposition is at least ten times that of the focused ion beam spot produced by the FIBS 104.

It will be appreciated that the flux of the thermal source 106 is varied with the flux of the FIBS 104 to proportions or fractions that influence the shape and spacing the microstructure or nanostructure morphology. For larger structures (e.g. >0.5-1.0.mu.m size) and larger spacing, the thermal-to-ion flux (TIF) ratio should be below 0.33.

The BBIS 102 is used with light or heavy species depending on the desired fine-tuning of the surface morphology. A sample light species would be Neon, and a sample heavy species would be Xenon. The BBIS 102 should produce a beam with a normal incident angle. The energy can vary from below 100 eV to about 1000 eV. The structures of FIG. 3 can be create with 1-keV Xe ions at normal incidence to the surface area.

Once the parameters of the beams are provided to the sources 102, 104, 106, step 306 involves forming a plurality of nanostructures or microstructures 116 in a first surface area 114 of the substrate 110 by exposing the substrate surface 112 to an ion beam 120 from the FIBS 104 ion beam source and thermal energy 122 from the thermal source 106. In this embodiment, a broad ion beam 124 as discussed above is also applied. To form exemplary microstructures, the fluence (dose), measured by the irradiation time multiplied by the ion flux, should be approximately $10^{16}$-$10^{17}$ cm$^{-2}$. By increasing the fluence, wider spacing between structures of on the order of 1-10.mu.m can be achieved.

As discussed above, the ion beam 120 from the FIBS 104 has a first area of effect or spot size on the substrate surface of 0.5 to 1.0 mm. The thermal energy 122 has an second area of effect or spot size on the substrate of at least ten times the first area of effect of the ion beam 120. Naturally, each of the first area and the second area includes the first surface area 114 in which the nanostructures and/or microstructures 116 are formed. In other words, the coincident beams under the set of control parameters produce a plurality of structures.

It will be appreciated that the focused ion-beam 120 is preferably of normal incidence to the substrate surface 112 or at angles of no more than 45 degrees. The thermal beam 122 can be an incident direction because the irradiation-induced etching step will remove an unwanted corrugation (order of 10-50 nm rms roughness) from deposition.

As shown in FIG. 3, different size structures 302, 304 may be produced across a gradient if desired. This may be accomplished in a number of ways. Firstly, as discussed above, the flux gradient of the ion beam 120 may vary sufficiently to produce structures of different sizes at different areas on the surface 112 without moving the beam. Secondly, two ion beams with different parameters may be used simultaneously—one having a first TIF (with respect to the thermal source 106) for producing the structures 302, and the other having a second, different TIF (with respect to the thermal source 106) for producing the structures 304. Finally, the parameters of the FIBS 104 may be altered as the beam 120 is moved or rastered from a first area producing the structures 302 to the area producing the structures 304. In such a case, a predetermined sequence of parameters may be used to produce different structures in different areas of the substrate surface 112.

Advanced Synthesis Process

Thus, the advanced synthesis process according to the present disclosure in general includes a sequenced combination of broad and focused ion-beams combined with thermal metal and/or reactive atoms (e.g. B, C, N, O and/or F) where their combination yield high-fidelity control of the surface chemistry, topology and structure of surfaces and interfaces in either bulk or thin-film configurations. This technology is defined as directed irradiation synthesis (DIS) due to its intrinsic dependence on irradiation-driven mechanisms (e.g. such as sputtering and ion-induced surface diffusion) at the surface 112. This control also allows the synthesis of small (e.g. 10-1000 nm) clusters of various shapes and designs on candidate substrates. The technology advantageously makes use of mass-redistribution limited regime where surface erosion and diffusion dictate self-organization into micro- and nano-scale structures. The technology also includes carefully controlling sequence and beam profile configurations to obtain desired surface erosion-dominated mechanisms to control size, shape and composition of micro and nano-scale structures. This approach to combinatorial design space across multiple scales (e.g. atomic to nano to micro) is one advantageous aspect of DIS. Control parameters include the ion beam flux to thermal flux ratio variation in sequence in combination with varied energy and incidence of angles. For example, DIS can include three different ion-beams with two focused beams and one broad-beam with a profile that renders a controlled gradient of the flux of ions laterally over the surface of the sample. In addition, the technology described in the present disclosure can use the energetic ions to improve the chemical and mechanical properties of the nanostructured surfaces. Ion implantation has been applied to the modification of metals for improving the wear and corrosion resistance. The ultimate goal for ion implantation in this context can be to simultaneously influence the biochemistry and biomechanics of candidate coatings for improving biomedical implants.

Figure 4:
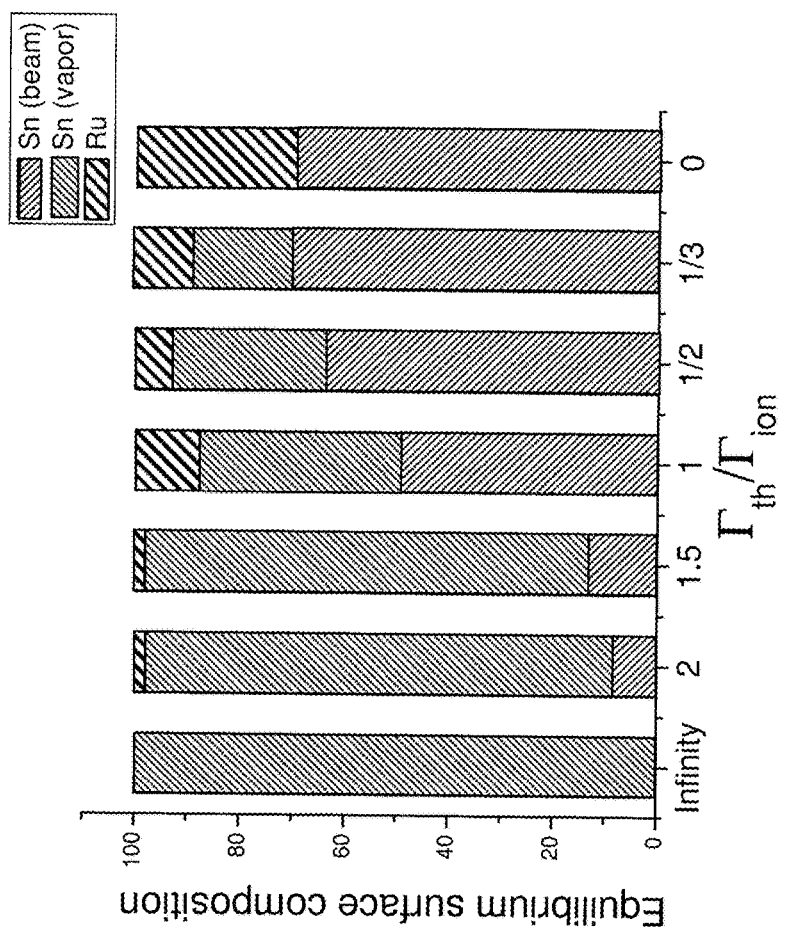
FIG. 4 shows a graph of computational simulations illustrating changes in surface composition as a function of controlling the ratio of fluxes between thermal and energetic particles of an exemplary metal.

To further describe the technology, take for example a case where Sn energetic ions (120) and Sn thermal atoms (122) arrive at a surface 112 of a thin-film, in this case ruthenium (Ru). Computational simulations with generated modeling code shown in FIG. 4 show how by controlling the ratio of fluxes between thermal and energetic particles of Sn (i.e. beams 120 and 122 of FIG. 1), substantial changes to surface composition and ultimately physical properties are possible.

Figure 5:
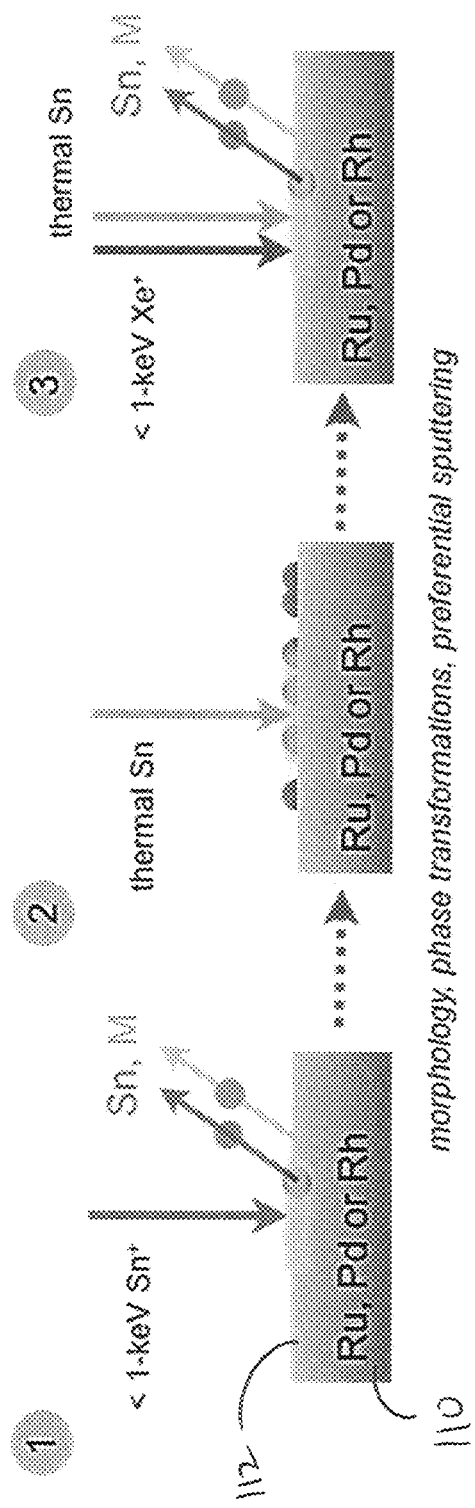
FIG. 5 shows a schematic of the DIS synthesis process for energetic, thermal and combined energetic-thermal metal beams on a transition-metal thin-film.

An example of physical changes driven by compositional changes on the surface is shown in FIG. 5 (illustrates the conditions for in-situ DIS experiments that demonstrate the capability). Referring to FIG. 5, a schematic of the DIS synthesis process for energetic, thermal and combined energetic-thermal metal beams on a transition-metal thin-film is depicted. The process is not dependent on any of these elements and considers the chemical potentials of the incident metal species and surface free energy of the implanted vs. deposited metal particles and the substrate (e.g. thin-film) material. Therefore the example described herein is not intended as limiting, rather its used to illustrate the concept of combining multiple beams (e.g. in this case a thermal and energetic metal beam) that depending on their flux ratios and ion-beam profile can induced spontaneous self-organized patterns on the surface of the thin-film. This balance can lead to significant changes in surface composition and surface nanoscale morphology or patterning that ultimately can dramatically change the physical properties of the system. In this case the optical reflectivity of the Ru thin-film (can be also Pd or Rh) is significantly changed in the extreme ultraviolet wavelength range.

Figure 6:
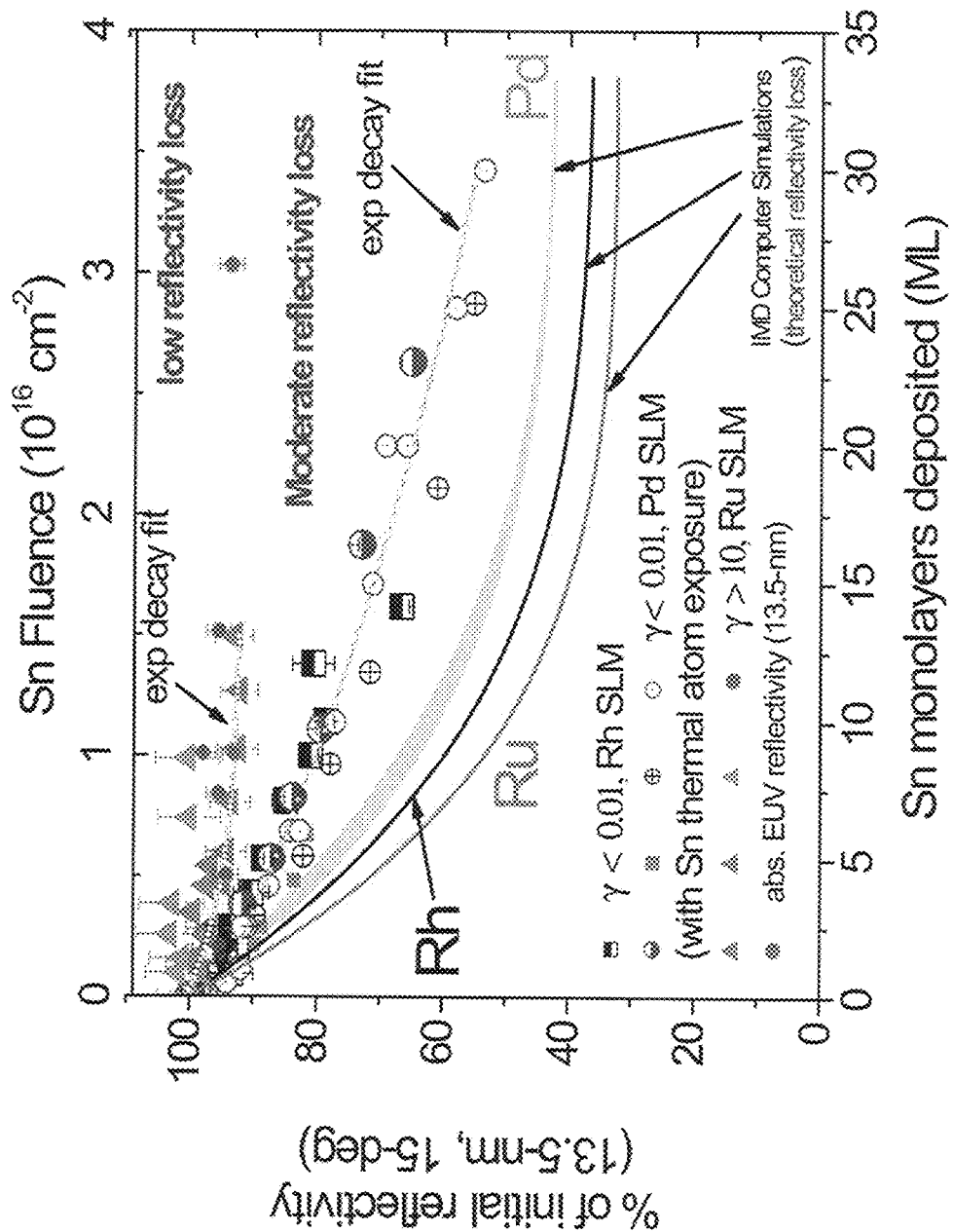
FIG. 6 shows a graph of exemplary in-situ data for DIS-generated surface patterns that influence the optical EUV reflectivity of a system.

FIG. 6 shows an example of the in-situ data for DIS-generated surface patterns that influence the optical EUV reflectivity of the system. Referring to FIG. 6, a graph of % initial reflectivity Sn fluence and Sn monolayer deposited is provided. The optical 13.5-nm relative reflectivity from thin films of Ru, Rh or Pd vs. the amount of Sn-particle monolayers either implanted (e.g. from energetic Sn ions) or deposited (e.g. from thermal Sn atoms) on the thin-film surface. The concentration of Sn varies on the surface as a function of the g ratio of ion flux to thermal flux. Further detail regarding experimental results that provided the data in FIG. 6 is provided below in connection with FIGS. 11-14

Advanced Tooling

An improvement to the method of FIG. 2 includes the ability to monitor some of the changes to the substrate surface 112, which can be used to optimize and/or enhance certain processes. To this end, FIG. 7 shows a schematic diagram of a unique tool system 700 that includes the elements of the system 100 of FIG. 1, but further includes devices and methods for monitoring and controlling the process.

More specifically, it is advantageous that the system be ultimately "scalable" both in duty cycle (e.g. high-volume manufacturing) and, more importantly, in synthesizing structures from the atomic to nano to micro-scale. This multi-scale approach and the manipulation of mechanisms across various time scales is facilitated by the processing system 700 of FIG. 7.

In general, the system 700 includes a collection of ion-beam sources, for example, the sources 102 and 104 of FIG. 1, a source of thermal atoms (either reactive or non-reactive), for example, the thermal source 106 of FIG. 1, an in-situ diagnosis unit 702 of the modified surface and emission plume, and a controller 704. The diagnosis unit 702 allows for templates or modified surfaces/interfaces during processing. In-situ diagnosis allows for direct correlation of the surface nano structures (or microstructures) and surface composition. Based on characteristics measured in in situ by the diagnosis unit, the controller 704 may alter the parameters of one or more of the beams 102, 104 and 106.

The general processing tool is within a conventional thin-film growth vacuum system 706 with base pressures between $10^{-7}$-$10^{-8}$ mbar. The first component as stated earlier includes a series or collection of ion-beam sources 102, 104 juxtaposed to tailor ion flux, incidence angle with respect to the sample surface and energy. A plurality of FIBS may be used to achieve different morphologies in different areas of the substrate 110, as mentioned above. The surface and energy are important in dictating the surface morphology along with the thermal atom flux. A series of thermal atom sources (e.g. source 106) is used in conjunction with ion-beam sources. As discussed above, the flux ratios between ion-beam sources 102 and thermal atom beam sources 106 are tuned depending on desired surface morphology and surface composition.

There may be a need for additional ion-beam energy onto a surface and modulation of the beam profile, which can be accomplished with a focused ion-beam source that is rastered along the irradiated surface plane.

Figure 7:
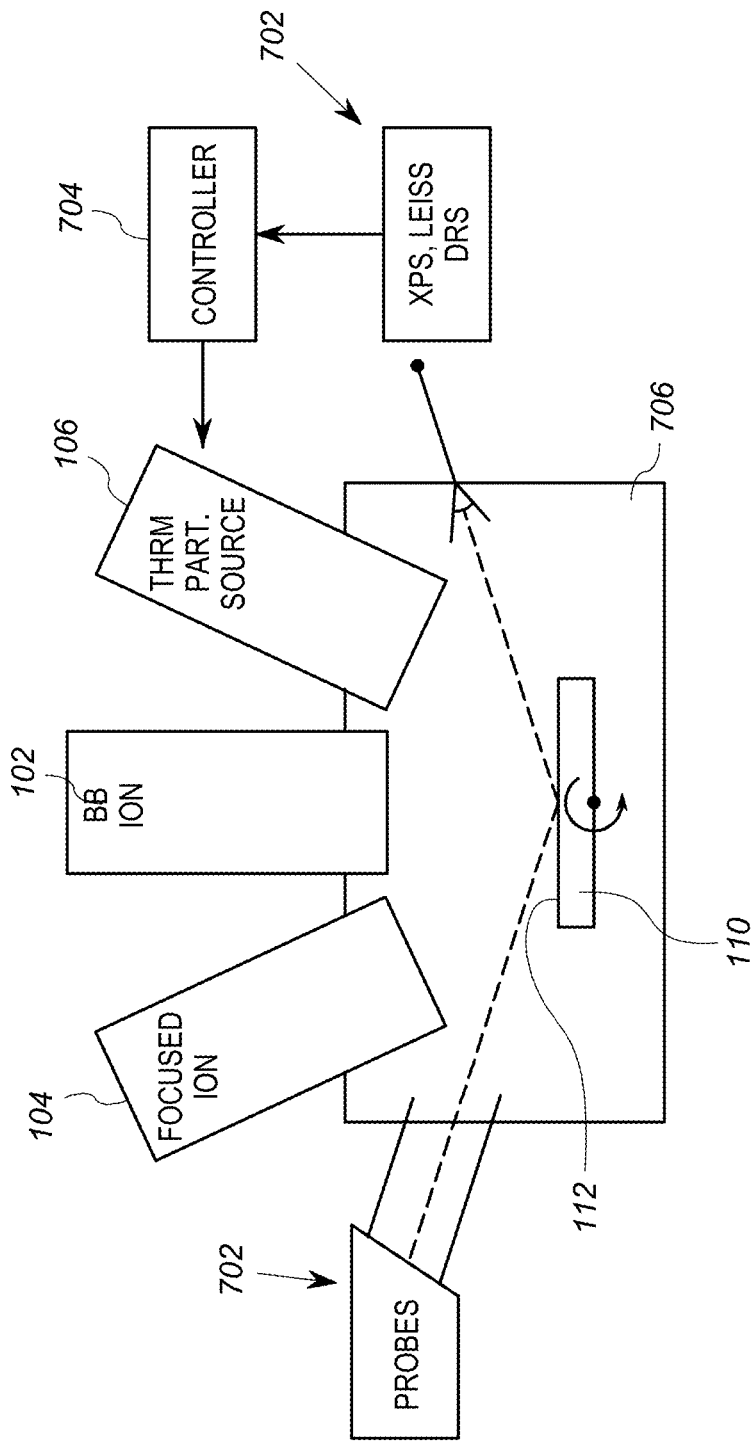
FIG. 7 shows a schematic diagram of an exemplary embodiment of a system that includes the components of FIG. 1 as well as devices for monitoring and controlling the process.
Figure 8:
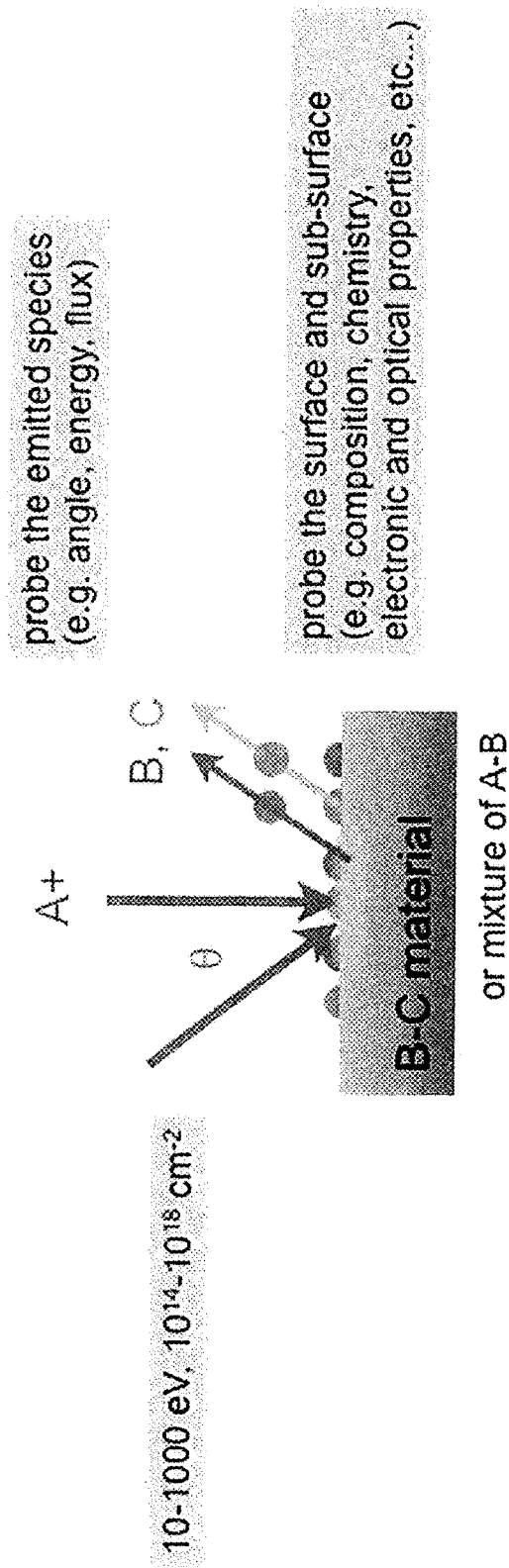
FIG. 8 shows a schematic diagram of the process of obtaining in-situ measurements of a process on the substrate.
Figure 9:
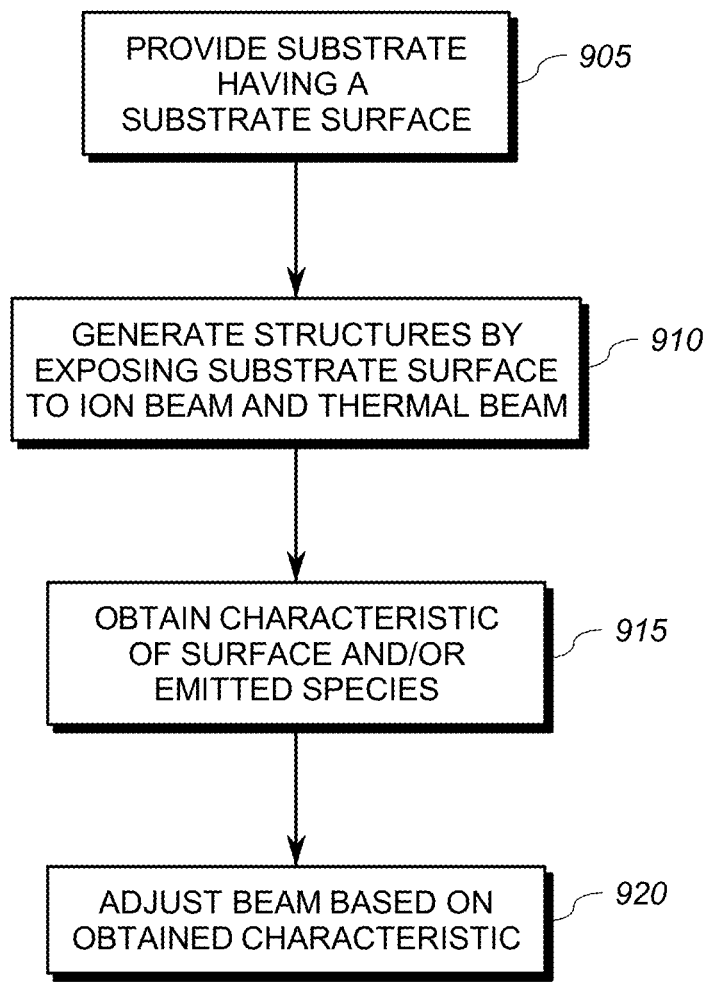
FIG. 9 shows a flow diagram of an exemplary process that may be implemented using the system of FIG. 7.

FIG. 9 shows a flow diagram 900 of an exemplary process that may be implemented using the system 700 of FIG. 7. Reference is also made to FIG. 8. FIG. 8 shows a schematic diagram of the process of obtaining in-situ measurements of a process on the substrate.

With reference to FIG. 9, the process begins with providing the substrate 110 having the substrate surface 112 (step 905). Thereafter, in step 910, the method includes generating nano structures or microstructures on the substrate surface 712 at least in part by exposing the substrate surface to thermal particles A from a thermal particle source (e.g. 106) while irradiating the substrate surface with an ion beam D (e.g. 104).

In step 915, the probe (i.e. diagnosis unit 702) obtains a measurement of a characteristic of the substrate surface 712. The measurement may suitably be taken from the emitted species B, C (See FIG. 8). The probe may suitable probe the surface to generate the emitted species, which is captured by a LEISS or other device, to measure the angle, energy and/or flux of the emitted species. One or more of those parameters can provide information regarding the surface chemistry and/or other surface characteristics of the substrate 710. Examples of this are discussed below in connection with the experimental results and FIGS. 11 to 14.

In step 920, at least one of the thermal particle source and the ion beam may be adjusted based on the measurement taken in step 915. This may be used to ensure proper processing or to effectuate a sequence of beam characteristics based on the evolution of surface characteristics. In the embodiment of FIG. 7, this step is carried out automatically by the controller 704 (which includes a processing circuit). However, step 920 may be done manually.

A number of examples of multi-functional micro- and nano-scale structures that demonstrate reduction to practice of directed irradiation synthesis were investigated. We also list a number of DIS applications of the technology to demonstrate the breadth of the use of the technology.

DIS Applications for Quantum Dot Nanomanufacturing

Figure 10A:
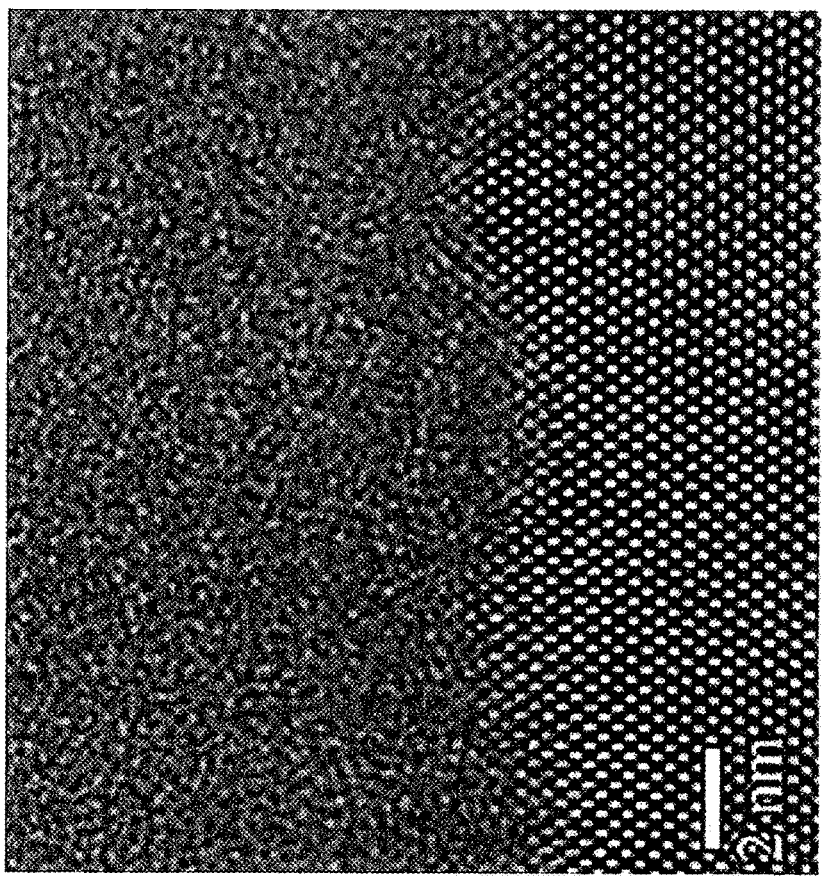
FIG. 10A is a transmission electron microscopy (TEM) image showing Si nanostructures manufactured with DIS.
Figure 10B:
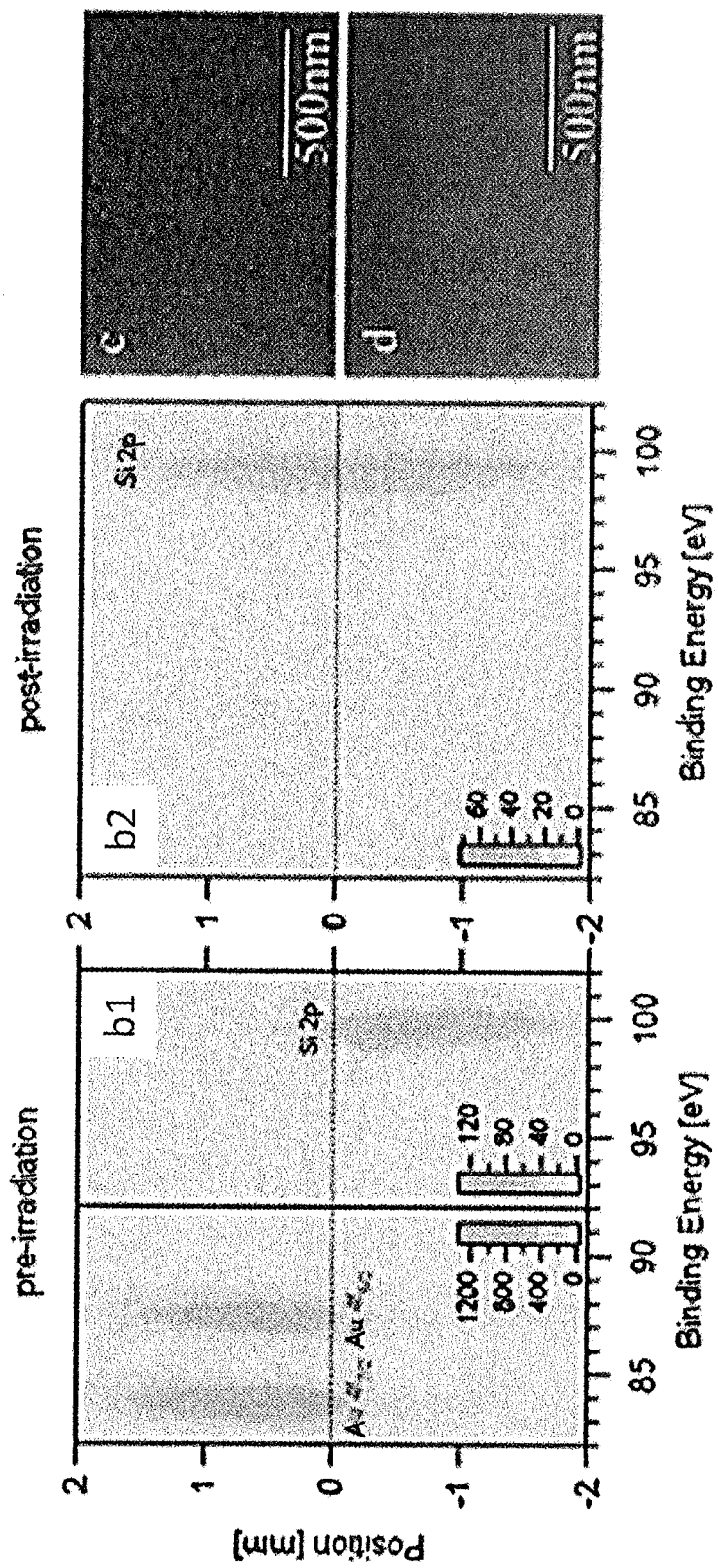
FIG. 10B shows 2-D XPS in-situ spectra showing a thin-film of 10-nm Au on Si for pre-irradiation and post irradiation, with corresponding TEM images.

While the example discussed further above in connection with FIG. 3 shows microstructures 302, 304 generated using DIS techniques, DIS techniques may also be used to manufacture nanometer structures on a substrate in large scale. For example, structures between 1-10 nm in size are desired from a family of semiconductors that can be used for quantum computing, spintronics and other advanced nano-electronic devices. FIG. 10A shows DIS-generated nanoscale Si structures of about 1.5-2.0 nm in size manufactured over a 1-cm.sup.2 area in a few seconds. In particular, FIG. 10A is a transmission electron microscopy (TEM) image showing Si nanostructures nanomanufactured with DIS. FIG. 10B shows 2-D XPS in-situ spectra showing a thin-film of 10-nm Au on Si for pre-irradiation (b1) and post irradiation (b2), with corresponding TEM images c and d. Irradiation-induced mechanisms lead to the synthesis of Si nanostructures only on the surface covered by Au.

The spatial scalability is limitless only restricted by the broad-beam ion sources, which can effectively irradiate 300-mm conventional wafer areas. Thermal and focused-ion beam sources also are scalable and thus throughput is well in range of today's nanomanufacturing levels averaging 150-200 wafers-per-hour (wph). The ultra thin-film synthesis can be combined with post-deposition combined irradiation and thermal atom deposition to further functionalize the nanomanufactured quantum dots into 3D nanoscale multi-functional structures. The balance between erosion and surface diffusion-dominated regimes can precisely control layered functional structures to yield multi-functional performance including combining nanoelectronic properties with optical properties and advanced chemical properties from one structure and one nanomanufacturing step.

DIS Applications for Bone Contact Implants

Biomaterials that are utilized to be definitive or temporarily in contact with bone, are susceptible to be surface improved and properly designed by DIS. Metal, ceramics and polymers parts of joint prosthesis, dental and crowns implants, as well as osteo-synthesis materials can be properly surface modified. In case of titanium used for both joints replacements and dental implants, DIS is a unique technique to obtain optimum micro and nano roughness parameters to improve osteoblasts adhesion and proliferation. Micro and nano roughness are optimized for optimum adhesion of both osteoblasts and proteins, which implies a better osteointegration of titanium implants. Specifically, vertical and horizontal roughness parameters are both micro and nano scale can be simultaneously and precisely controlled by DIS, optimizing cells adhesion and osteointegration in a unique manner.

Ceramics parts used in both joints and dental crowns replacements can be also improved by DIS technique. Critical properties of these parts for their performance, wear resistance and fracture toughness, are clearly enhanced by nano structuring of their surfaces: surface confined nanostructure of bioceramics increases surface hardness and fracture toughness, which are crucial properties for joints and crowns replacements. Controlled defects at the surface of these bioceramics allowed the existence of a novel toughening mechanism of nanodefects or nanocracking, which focused at the surface enhancing the fracture toughness.

Polymers parts of joints replacements frequently suffer wear and debris, which produces bone necrosis and further implant loosening. DIS technique allows a unique controlled surface hardening of polymers parts, improving their wear resistance. This is achieved by a novel DIS effect to control the polymer crystallinity in an outer layer of the bulk material.

DIS Applications for Increased Hemocompatibility of Cardiovascular Biomaterials

Biomaterials in prolonged contact with blood should be surface modified in order to avoid activation of different systems of coagulation cascade. Nanostructured and bio-functionalized surfaces obtained by DIS ensure the blood compatibility of stents, vessel grafts and valves materials used for cardiovascular applications. In other words, surfaces obtained by DIS technique doesn't affect hemostasis equilibrium normally present between inner walls of blood vessel and blood itself. New nanostructured surfaces obtained by DIS ensure that all biomaterials in prolonged contact with blood will not activate the different systems of coagulation cascade and further thrombus and formation.

DIS Applications for Enhance Corrosion Resistance of Coatings and Bulk Materials, as Well as for Wear Resistance and Fracture Toughness of Hard Materials Desired goal of mechanical equilibrium for hard and brittle materials for tools is that one between hardness (wear resistance) and fracture toughness. Nanostructured surfaces on hard and brittle materials controlled by DIS technique allow us to get a unique optimum equilibrium between hardness and fracture toughness of tools hard materials. Surfaces confined nanostructure enhances surface hardness of tools, as well as that nanostructure and controlled nanodefects enhance the necessary energy to propagate natural/processing defects which are present within those tools. Nano structured surfaces by DIS increase corrosion resistance of metals and ceramics in a novel and drastic manner. DIS modified surfaces generate a stronger barrier for aggressive environments as well as also increase the corrosion potential of many bulk metals and coatings. Controlled nano structure and nanodefects of metals at an outer layer by DIS, as well as chemical composition, improves defects (dislocations, vacancies, etc.) distribution which means higher corrosion potential due to much lower sensitive to create local electrochemical cells between anodic and cathodic areas.

DIS Application for Cell Regrowth in Damaged Areas of the Spinal Cord and Brain

The technology described in the present disclosure has potential impact on the field of regenerative medicine. Recent literature supports the novel method of using nano-topography to regulate and control cell fate. The technology described in the present disclosure would be able to promote adhesion, migration, and alignment of cell function by altering topography structure. In particular this has implications on the nervous system. The technology described in the present disclosure can lead to precise surface topographies that allow neurons coupled with biophysical and biochemical cues to promote regrowth in damaged areas of the spinal cord and brain.

DIS Application to Promote Broad Range of Device Implantation, Application, and Effectiveness by Minimizing Foreign Body Response (FBR)

The technology described in the present disclosure has potential impact on a broad range of devices including medical/pharmaceutical applications. A few examples of specific devices include; biosensors, catheters, and even artificial organs. Many of these types of devices perform promising in lab settings but fail during clinical applications. It is very costly and difficult to replicate in vitro and in vivo experiments to mimic the body's unique response to the device. The difficulty in replicating preliminary results found in a lab to clinical studies factors greatly on the body's unique response to the material once implanted. The body naturally reacts via an inflammatory and would healing response following foreign material implantation. Depending on the extent of the injury in the implantation procedure and the materials that make up the actual device FBR can be mild to severe. To minimize FBR, DIS is able to alter the surface morphology of a device regardless of its material composition. Through particular surface construction it will not only help minimize FBR but also promote functionality and longevity by protecting the material against things like colonizing bacteria. DIS can also accomplish this by not only altering the surface, but also developing a multi-functional nanostructured multilayer thin-film coating to promote targeted cell/tissue growth and regeneration.

Experimental Results

To investigate how reflectivity of 13.5 nm light and chemical composition are affected by irradiation, three separate Rh sample substrate surfaces and three separate Ru sample substrate surfaces were bombarded with energetic Xe+ and thermal Sn particles simultaneously as illustrated in FIG. 1. LEISS and EUV reflectivity in-situ characterizations were made at specific intervals in the experiment, after 3, 6, 12, 18, 27, and 36 minutes after the start of the experiment. To correlate these results with the final surface structure of the samples, ex-situ imaging was done at the Radiation Surface and Interface Science Engineering Laboratory at Purdue University using the atomic force microscope (AFM).

Experimental Setup

The multi-beam facility similar to the system 700 of FIG. 7 is equipped with various in-situ surface characterization techniques (i.e. the diagnostic unit 704), including both electron (Auger, photoelectron) and ion scattering spectroscopies, as well as a unique real-time ion-induced sputtering yield diagnostic based on a dual quartz crystal microbalance (QCM-DCU), capable of measuring deposition rates smaller than 0.1 nm/s by collection of sputtered material. The vacuum system includes two roughing pumps, an ion pump and a turbo-molecular pump; this vacuum system reaches ultimate pressures below $10^{-9}$ bar in a few hours.

Figure 11:
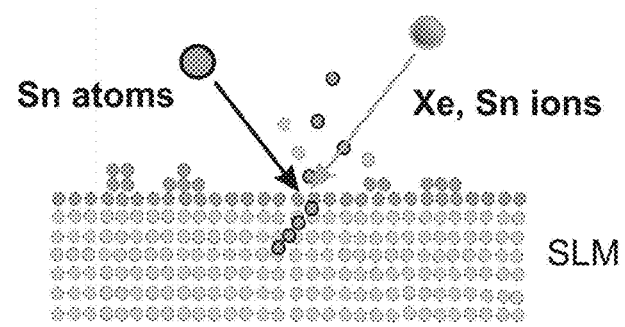
FIG. 11 shows a schematic illustration of single layer minors (SLMs) for gas-discharge produced plasma set-ups bombarded by energetic particles (Xe, Sn)

FIG. 11 shows an illustration of how the samples, single layer minors (SLMs) for gas-discharge produced plasma set-ups were bombarded by energetic particles (Xe, Sn), that typically implant in surfaces or sputter them, and exposed to thermal particles (Sn) that will typically nucleate on surfaces.

To simulate experimental conditions in a real EUV light source device, fast ions equivalent to candidate 13.5-nm radiator fuels are used. For the present disclosure, both thermal and energetic Sn were used exposing samples mostly at room temperature. For delivery of Sn material to the sample, two pieces of equipment are used. Exposure to thermal atoms is done using a four-pocket electron beam evaporator EGN-4 from Oxford Applied Research with one of the pockets loaded with Sn. The evaporator is operated upside down using a special crucible installed with pre-wetted Sn. The evaporator is calibrated two ways. First, the evaporator is tested in a separate test chamber using a single quartz crystal microbalance (QCM). The deposition rate of Sn is measured for a given current of Sn particles. Current monitors near the exit of the pocket measure an ion current proportional to the evaporative flux by a constant factor, which is material dependent. To confine the deposition of Sn to the sample (SLM), a nozzle was designed and constructed to limit the flux, such that the deposition was confined to the sample area. After the addition of the cone, the evaporated material is confined to the sample and the deposition spot has a size of about 5 mm in diameter centered on the sample. Based on the calibration with the single QCM, the deposition rate is 0.016 nm min$^{-1}$ nA$^{-1}$. Multiplying this value by the ion current measured by the flux monitor gives the deposition rate in nm/min. The second method of calibration is conducted in-situ utilizing the rotating quartz crystal microbalance—dual crystal unit (QCM-DCU). In this case the QCM-DCU is rotated to the sample position and the EGN-4 calibrated at various power levels. The first calibration method is necessary in case unexpected power levels are obtained, thus requiring a vent and check of the evaporator. In this manner, only the side vacuum chamber is vented. Typical Sn deposition rates used for most studies presented were measured to be about 0.2 nm/min, depending on the particular experiment conducted.

For delivery of energetic Sn flux, a metal ion source currently operated with Sn is used. A slug of Sn is heated inside the gun ionizer, and metal ions are generated. These ions are transported to the exit of the gun by a set of electrostatic lenses, which can be controlled to modify the beam current and size. The exit of the source is equipped with an octupole lens system, which rasters the Sn-ion beam in two directions. In addition to the optical column, the source is also equipped with a 3.degree. bend Wein filter, which only allows particles with a particular mass to charge ratio to exit the gun. The selection of the mass or charge state of the ion is done by varying the current on the filter's electromagnet. The source can produce an ion beam with up to 50 nA of current and a 1 to 2 mm spot diameter resulting in ion fluxes in the range $10^{10}$-$10^{12}$ ions cm$^{-2}$. The sample holder includes an UHV heater that can heat the sample to temperatures near 500 C. In addition, studies of ion-surface interaction can be done either at normal incidence with respect to the minor sample surface normal or at oblique incidence using a rotating manipulator with resolution of about 0.5 degrees rotation.

Figure 12:
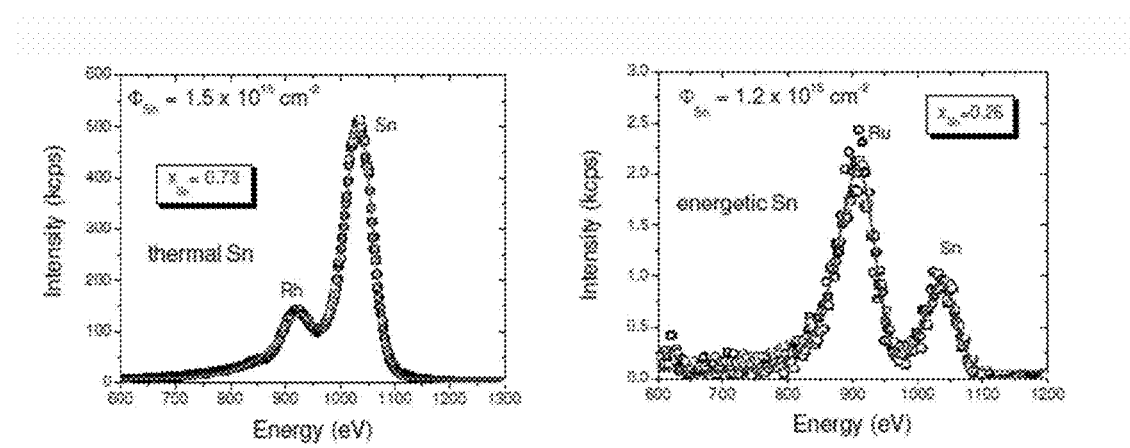
FIG. 12 shows the LEISS spectra for thermal and energetic (e.g. irradiated) Sn on Ru sample cases.

Characterization is conducted in-situ using low-energy ion scattering spectroscopy (LEISS). In other words, the diagnosis unit 702 of FIG. 7 may suitably include a LEISS. FIG. 12 shows the LEISS spectra for thermal and energetic (e.g. irradiated) Sn on Ru sample cases. The cross-section for elastic scattering collisions is similar in magnitude between the incident ion, He, and samples surfaces that include: Rh, Rh and Sn. The peaks associated with Sn and the underlying thin-film surface (e.g. Rh vs Ru) are largest for Sn atom deposition. This is consistent with a sputter-induced mechanism, which maintains a partial Sn fraction on the samples with irradiated Sn.

Results and Analysis

Figure 13:
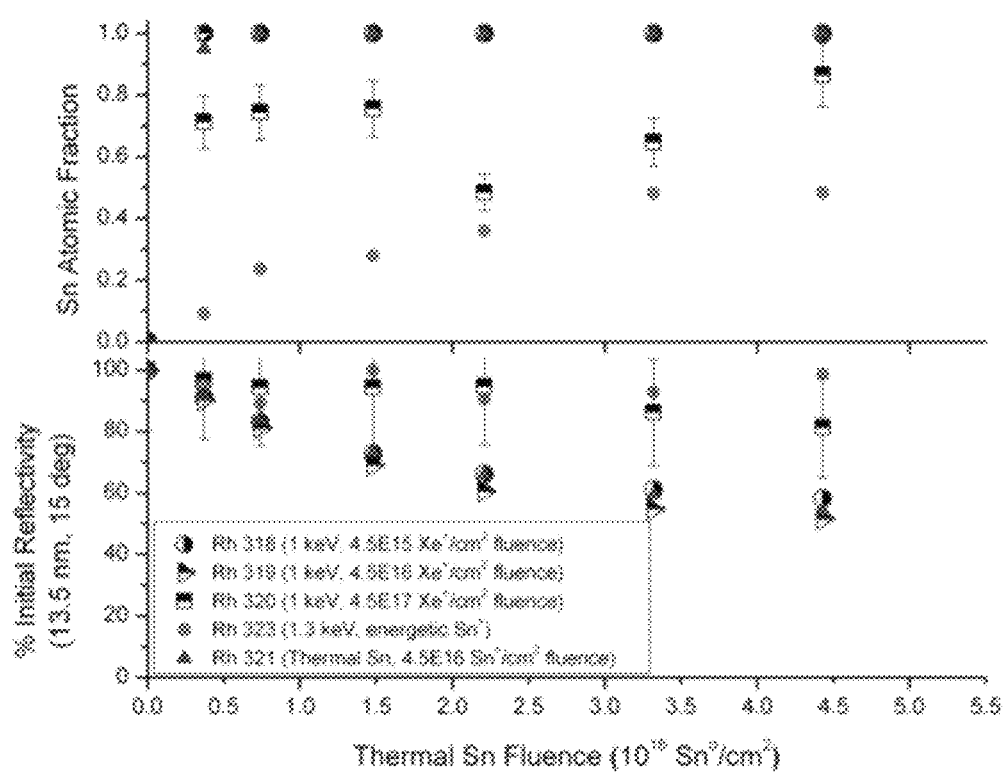
FIG. 13 shows result of surface Sn fraction as a function of fluence with the relative 13.5-nm reflectivity evolution during exposure of Rh mirror surfaces, as well as relative EUVR in percent loss from the initial reflectivity.

Simultaneous Irradiation with Xe and Deposition with Sn Particles FIG. 13 shows result of surface Sn fraction as a function of fluence with the relative 13.5-nm reflectivity evolution during exposure of Rh minor surfaces. FIG. 13 also shows relative EUVR in percent loss from the initial reflectivity.

Relative reflectivity of Rh-318 and Rh-319 decreased by 41.6% and 48.5%, respectively, after 36 minutes. Rh-320 had a higher energetic particle fluence, but relative reflectivity was phenomenally well maintained, with a loss of only 18.3%. While reflectivity of Rh-318 and Rh-319 decreased as the experiment progressed, Rh-320 had a local maximum at approximately $2.21 \times 10^{16}$ Sn cm$^{-2}$ where reflectivity increased to 94.7%. The corresponding Xe+ fluence, $2.25 \times 10^{16}$ Xe+cm$^{-2}$, exceeds the final fluences for the other two samples. This suggests that Rh-320 reached a threshold—too high for the other samples—where the surface changed such that reflectivity could reach a maximum. Whether this threshold is related to fluence of one debris type (thermal or energetic particles), the ratio between the Xe+ and Sn particle fluences, flux (rate of deposition or irradiation), or something else, cannot be determined from the data in the present disclosure.

LEISS measurements gave the surface fraction of Sn, which for Rh-318 and Rh-319 already at the first measurement after 3 minutes of exposure, was 1 (fully covered). The corresponding EUV reflectivity measurements were 91.1 and 90.1%, which then decreased as more Sn was deposited. As the Sn coating grows thicker, the incoming photons would switch from interacting with shallow Rh atoms to interacting more with the less reflective Sn atoms. Since a full layer of Sn covered Rh-318 and Rh-319 throughout the experiment, it would suggest that this transition of photon interaction took place but cannot be verified since Sn layer thicknesses were not measured. For Rh-320 the surface fraction of Sn is initially around 0.7, then at a Sn fluence of $2.21 \times 10^{16}$ cm$^{-2}$ the fraction drops to 0.485: this drop corresponds to the maximum in EUV reflectivity. Close examination of the data points FIG. 6 reveal that as the Sn fraction increases, corresponding reflectivity decreases. This negative correlation indicates that elemental composition of the surface has a direct effect on EUV reflectivity, and that Sn specifically is detrimental as compared to Rh.

The AFM investigated the morphology of the samples. Analysis software from the AFM supplier was used to calculate surface roughness: area Ra, area RMS (root mean square), average height, and maximum height. Table 1 illustrates the results. Three regions were identified for exposure of samples. These regions were modified according to the ion flux to atom flux ratio levels across the surface of the sample. Region 1 has the highest ion flux down to Region 3 with the least amount. Region 1, a very small region located at the center of region 2, for Rh-319 and Rh-320 seemed almost sputtered clean because of the energetic LEISS beam, although the Ne+ flux was low. The scan of region 1 for Rh-318 shows peculiarly strong growth, and in fact, despite efforts to aim the LEISS beam dead center, region 1 may not have been where it was expected it to be. Region 2 was targeted by the EUV beam (diameter 3-5 mm) and is therefore expected to have the strongest effect on reflectivity. Region 3 should not have any effect since the region lies outside of the area where reflectivity measurements were taken. Region 3 would, however, affect LEISS scans. According to the region 3 images of Rh-318 and Rh-319, irregularities fill the entire view. According to FIG. 6, Sn covers their whole surfaces. Region 3 for sample Rh-320 looks less dense, and this correlates with the Sn surface fraction being less than 1. The Sn surface fraction for Rh-318 and Rh-319 was 1 throughout the experiment. Region 2, which has a greater effect on LEISS than region 3, looks as if it contains islands. Therefore, it can be extrapolated that the space between islands is covered in Sn. The surface of Rh-320 is not entirely covered in Sn, since more of the surface and Sn impurities are sputtered away by the high Xe+ fluence. Exposed Rh, probably in the spaces between islands, is detected by LEISS and contributes to the stable EUV reflectivity of the sample compared to Rh-318 and Rh-319.

Region 3 shows more intense growth than region 2 for all samples. Roughness analyses for Rh-318 and Rh-319 reveal that region 2 contains structures that may look more spaced out that region 3, but the area is rougher (the spacing is represented by average being lower than region 3, but maximum height is much higher). Rh-318 has a higher RMS than Rh-319, but better reflectivity (although with errors, the reflectivities are incredibly close). While roughness has an effect on EUV reflectivity, so has centers of absorption: the number of islands or areas that will absorb 13.5-nm light (like Sn) rather than reflect it (like Rh). Assuming that islands are purely Sn, and hence effective centers of absorption, Rh-319 has more of them and therefore absorbs more 13.5-nm light than Rh-318.

For Rh-320 region 2 is smoother than region 3 because the structures are smaller. This correlates with reflectivity measurements and it can be concluded that a rougher surface is less reflective. As the structures become smaller (occupy less area, smaller height), relative to the wavelength of the light, the surface will "look" uniform to the light because it cannot resolve the structures as well. This is seen in Rh-318 and Rh-319, where the RMS and average height exceed 13.5 nm, whereas for Rh-320 they are smaller.

Figure 14:
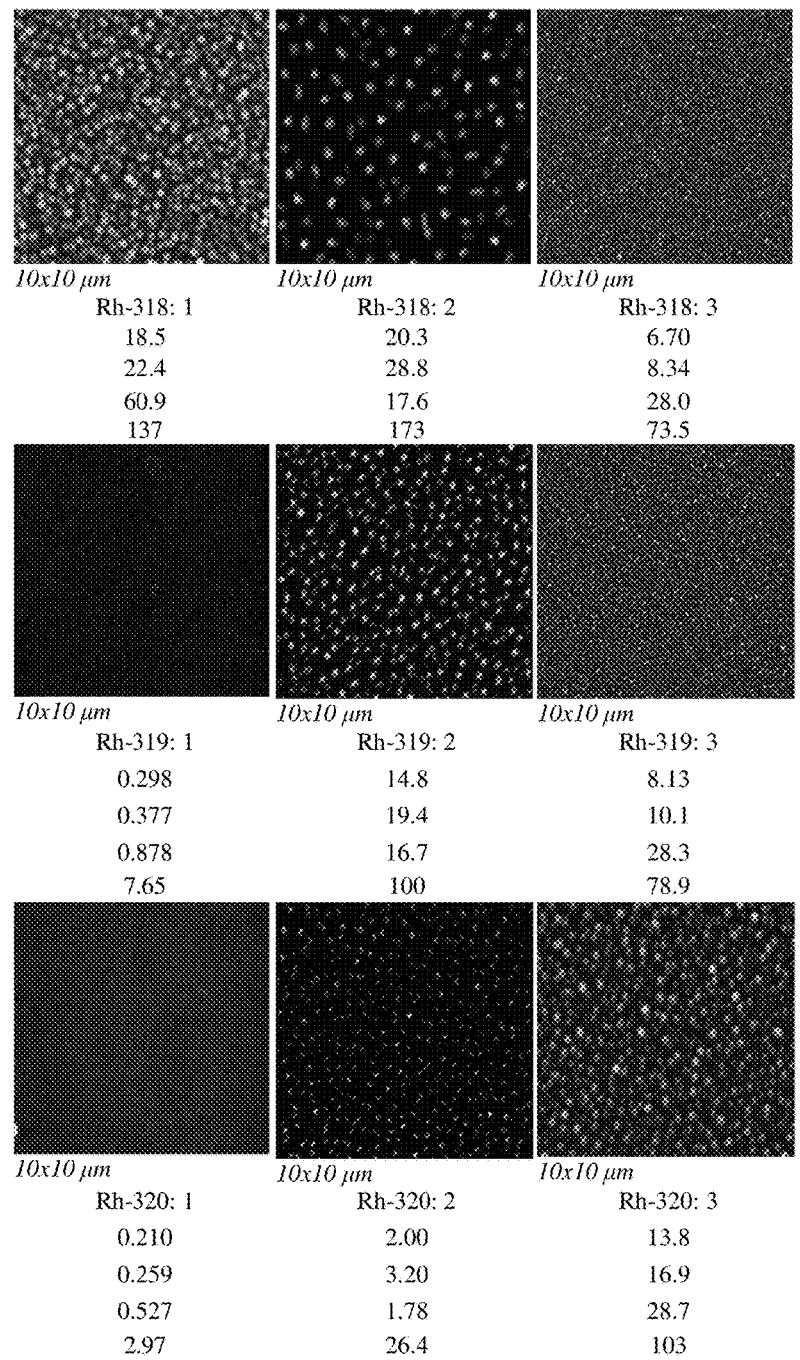
FIG. 14 shows two-dimensional (10.times.10.mu.m) atomic force microscope (AFM) images and roughness values.

FIG. 14 shows two-dimensional (10.times.10.mu.m) atomic force microscope (AFM) images and roughness values calculated with the AFM computer analysis program.

It will be appreciated that at least some advantages of one or more embodiments described herein is that structures much smaller than the incident beams (e.g. beams 102, 104, 106) may be created, thereby allowing potentially for larger scale manufacturing of devices. One or more of the beams (e.g. the FIBS 104) may be rastered (with parameter variation) to generate micro or nano structures having varying topologies on the same substrate.

Those skilled in the art will recognize that numerous modifications can be made to the specific implementations described above. To implementations should not be limited to the particular limitations described. Other limitations may be possible.

What is claimed is:

1. A method for fabricating structures on a substrate, comprising:
   a) providing the substrate having a substrate surface; and
   b) providing a set of control parameters to an ion beam source and to a thermal source corresponding to a desired structure topology;
   c) using directed irradiation synthesis to form a plurality of structures comprising at least one of the group of nano structures and microstructures in a first surface area of the substrate by exposing the substrate surface to an ion beam from the ion beam source and to thermal particles from the thermal source, the ion beam having a first area of effect on the substrate surface, and the thermal particles having an second area of effect on the substrate surface, each of the first area of effect and the second area of effect including the first surface area; and
   wherein the set of control parameters includes a predetermined ratio of a flux of the ion beam to a flux of the thermal beam, the predetermined ratio configured to form self-organized structures of the desired structure topology.

2. The method of claim 1, wherein the substrate surface comprises a metal thin film substrate.

3. The method of claim 2, wherein the metal thin film substrate comprises Rh, Ru or Pd.

4. The method of claim 3, wherein the thermal particles are metal thermal particles.

5. The method of claim 1, wherein the ion beam source comprises a focused ion beam source.

6. The method of claim 5, wherein step c) further comprises forming the plurality of structures by additionally exposing the substrate surface to a second ion beam from a broad beam ion source, the broad beam ion source generating a broad ion beam having an area of effect that exceeds the first area of effect.

7. A method for fabricating structures on a substrate, comprising:
   a) providing a substrate having a thin film substrate surface;
   b) generating nanostructures or microstructures on the substrate surface at least in part by exposing the substrate surface to thermal particles from a thermal particle source while irradiating the substrate surface with an ion beam;
   c) obtaining a measurement of a characteristic of the substrate surface;
   d) adjusting at least one of the thermal particle source and the ion beam based on the measurement; and
   wherein step c) further comprises obtaining at least one characteristic of an emitted species generated in step b); and step b) further comprises generating the nanostructures or microstructures by inducing spontaneous self-organized patterns on the surface of the thin-film substrate surface.

8. The method of claim 7, wherein the at least one characteristic comprises an emission angle of the emitted species.

9. The method of claim 7, wherein the at least one characteristic comprises an energy value.

10. The method of claim 7, wherein the at least one characteristic comprises a flux value.

11. The method of claim 7, further comprising employing a probe to obtain a surface characteristic of the substrate surface.

12. The method of claim 11, wherein the surface characteristic comprises at least one of the group consisting of a chemical property, an electronic property and an optical property.

* * * * *